United States Patent
Yu et al.

(10) Patent No.: US 10,347,606 B2
(45) Date of Patent: Jul. 9, 2019

(54) DEVICES EMPLOYING THERMAL AND MECHANICAL ENHANCED LAYERS AND METHODS OF FORMING SAME

(71) Applicant: Taiwan Semiconductor Manufacturing Company, Ltd., Hsinchu (TW)

(72) Inventors: Chen-Hua Yu, Hsinchu (TW); An-Jhih Su, Taoyuan (TW); Wei-Yu Chen, New Taipei (TW); Ying-Ju Chen, Tuku Township (TW); Tsung-Shu Lin, New Taipei (TW); Chin-Chuan Chang, Zhudong Township (TW); Hsien-Wei Chen, Hsinchu (TW); Wei-Cheng Wu, Hsinchu (TW); Li-Hsien Huang, Zhubei (TW); Chi-Hsi Wu, Hsinchu (TW); Der-Chyang Yeh, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/990,055

(22) Filed: May 25, 2018

(65) Prior Publication Data

US 2018/0277520 A1 Sep. 27, 2018

Related U.S. Application Data

(62) Division of application No. 15/058,818, filed on Mar. 2, 2016, now Pat. No. 9,984,998.

(Continued)

(51) Int. Cl.
*H01L 21/56* (2006.01)
*H01L 25/00* (2006.01)
(Continued)

(52) U.S. Cl.
CPC ........ *H01L 25/0657* (2013.01); *H01L 21/486* (2013.01); *H01L 21/4853* (2013.01);
(Continued)

(58) Field of Classification Search
CPC ................... H01L 21/56; H01L 23/481; H01L 2924/01079; H01L 25/0657; H01L 21/78;
(Continued)

(56) References Cited

U.S. PATENT DOCUMENTS 7,276,799 B2 10/2007 Lee et al.
8,361,842 B2 1/2013 Yu et al.
(Continued)

FOREIGN PATENT DOCUMENTS

CN 102931102 A 2/2013
CN 103077933 A 5/2013
(Continued)

*Primary Examiner* — Thinh T Nguyen
(74) *Attorney, Agent, or Firm* — Slater Matsil, LLP

(57) ABSTRACT

A method includes attaching a first-level device die to a dummy die, encapsulating the first-level device die in a first encapsulating material, forming through-vias over and electrically coupled to the first-level device die, attaching a second-level device die over the first-level device die, and encapsulating the through-vias and the second-level device die in a second encapsulating material. Redistribution lines are formed over and electrically coupled to the through-vias and the second-level device die. The dummy die, the first-level device die, the first encapsulating material, the second-level device die, and the second encapsulating material form parts of a composite wafer.

20 Claims, 24 Drawing Sheets

Related U.S. Application Data

(60) Provisional application No. 62/275,550, filed on Jan. 6, 2016.

(51) Int. Cl.
   *H01L 25/065* (2006.01)
   *H01L 21/48* (2006.01)
   *H01L 21/78* (2006.01)
   *H01L 23/31* (2006.01)
   *H01L 23/498* (2006.01)

(52) U.S. Cl.
   CPC .............. *H01L 21/56* (2013.01); *H01L 21/78* (2013.01); *H01L 23/3114* (2013.01); *H01L 23/49811* (2013.01); *H01L 23/49827* (2013.01); *H01L 23/49838* (2013.01); *H01L 25/0652* (2013.01); *H01L 25/50* (2013.01); *H01L 2224/04105* (2013.01); *H01L 2224/12105* (2013.01); *H01L 2224/18* (2013.01); *H01L 2224/32225* (2013.01); *H01L 2224/32245* (2013.01); *H01L 2224/73267* (2013.01); *H01L 2224/97* (2013.01); *H01L 2225/06527* (2013.01); *H01L 2225/06548* (2013.01); *H01L 2225/06555* (2013.01); *H01L 2924/3511* (2013.01)

(58) Field of Classification Search
   CPC ........... H01L 23/3114; H01L 23/49811; H01L 21/4853; H01L 25/50
   USPC ................ 257/774, 773, 777, 686, E23.085; 438/108, 109, 112, 629
   See application file for complete search history.

(56) References Cited

U.S. PATENT DOCUMENTS

| | | | |
|---|---|---|---|
| 8,552,567 B2 | 10/2013 | England et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,064,718 B1 | 6/2015 | Muniandy et al. | |
| 9,190,391 B2 * | 11/2015 | Kelkar | H01L 25/50 |
| 9,263,394 B2 | 2/2016 | Uzoh et al. | |
| 9,396,300 B2 | 7/2016 | Wang et al. | |
| 9,679,882 B2 | 6/2017 | Tung et al. | |
| 9,691,696 B2 | 6/2017 | Shen et al. | |
| 2008/0224322 A1 | 9/2008 | Shinogi | |
| 2010/0078770 A1 * | 4/2010 | Purushothaman | H01L 21/6835 257/621 |
| 2011/0254156 A1 | 10/2011 | Lin | |
| 2011/0291288 A1 | 12/2011 | Wu et al. | |
| 2012/0056316 A1 | 3/2012 | Pafaila et al. | |
| 2013/0026468 A1 | 1/2013 | Yoshimuta et al. | |
| 2013/0040423 A1 | 2/2013 | Tung et al. | |
| 2013/0062760 A1 | 3/2013 | Hung et al. | |
| 2013/0062761 A1 | 3/2013 | Lin et al. | |
| 2013/0105966 A1 * | 5/2013 | Kelkar | H01L 24/19 257/737 |
| 2013/0168848 A1 | 7/2013 | Lin et al. | |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0108661 A1 | 4/2015 | Vincent | |
| 2015/0145141 A1 | 5/2015 | Uzoh et al. | |
| 2015/0262928 A1 | 9/2015 | Shen et al. | |
| 2017/0162476 A1 | 6/2017 | Meyer et al. | |

FOREIGN PATENT DOCUMENTS

| | | |
|---|---|---|
| TW | 200919698 A | 5/2009 |
| TW | 201128747 A | 8/2011 |
| TW | 201523827 A | 6/2015 |
| TW | 201533810 A | 9/2015 |

\* cited by examiner

DEVICES EMPLOYING THERMAL AND MECHANICAL ENHANCED LAYERS AND METHODS OF FORMING SAME

PRIORITY CLAIM AND CROSS-REFERENCE

This application is a divisional of U.S. application Ser. No. 15/058,818, filed Mar. 2, 2016, and entitled "Devices Employing Thermal and Mechanical Enhanced Layers and Methods of Forming Same", which claims the benefit of the following provisionally filed: U.S. Provisional Application No. 62/275,550, filed Jan. 6, 2016, and entitled "Devices Employing Thermal and Mechanical Enhanced Layers and Methods of Forming Same," which application is hereby incorporated herein by reference.

BACKGROUND

Stacked dies are commonly used in Three-Dimensional (3D) integrated circuits. Through the stacking of dies, the footprint (form factor) of packages is reduced. In addition, the metal line routing in the dies is significantly simplified through the formation of stacked dies.

In some conventional applications, a plurality of dies is stacked to form a die stack, wherein the plurality of dies include Through-Substrate Vias (TSVs, sometimes known as through-silicon vias). The total count of the stacked dies may sometimes reach eight or more. When such a die stack is formed, a first die is first bonded onto a package substrate through flip-chip bonding, wherein solder regions/balls are reflowed to join the first die to the package substrate. A first underfill is dispensed into the gap between the first die and the package substrate. The first underfill is then cured. A test is then performed to ensure that the first die is connected to the package substrate properly, and that the first die and the package substrate function as desired.

Next, a second die is bonded onto the first die through flip-chip bonding, wherein solder regions/balls are reflowed to join the second die to the first die. A second underfill is dispensed into the gap between the second die and the first die. The second underfill is then cured. A test is then performed to ensure that the second die is connected to the first die and the package substrate correctly, and the first die, the second die, and the package substrate function as desired. Next, a third die is bonded onto the second die through the same process steps as for bonding the first die and the second die. The processes are repeated until all the dies are bonded.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
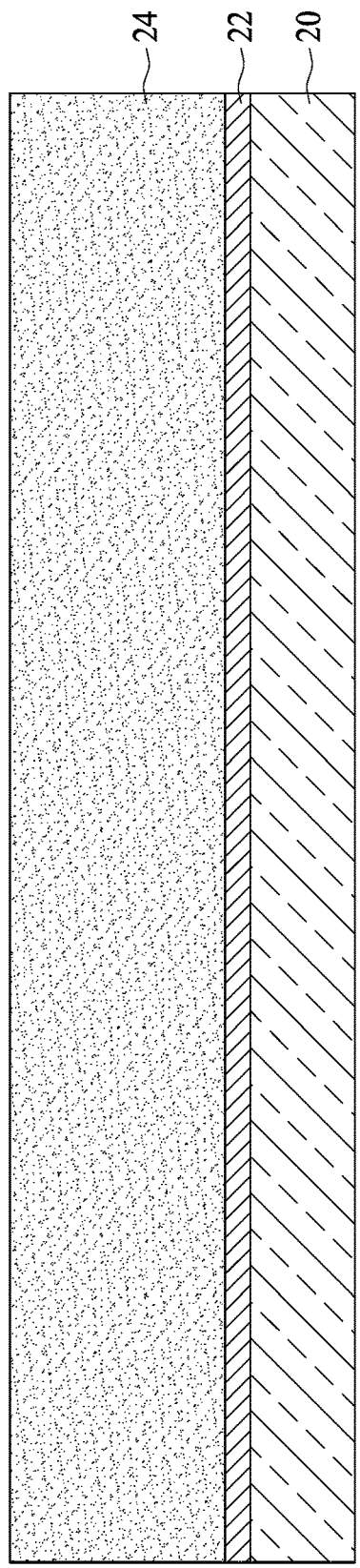
FIGS. 1 through 10 illustrate the cross-sectional views of intermediate stages in the formation of a multi-stacking fan-out package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated multi-stacking fan-out packages and the methods of forming the same are provided in accordance with various exemplary embodiments. The intermediate stages of forming the multi-stacking fan-out packages are illustrated. Some variations of some embodiments are discussed. Throughout various views and illustrative embodiments, like reference numbers are used to designate like elements.

Figure 23:
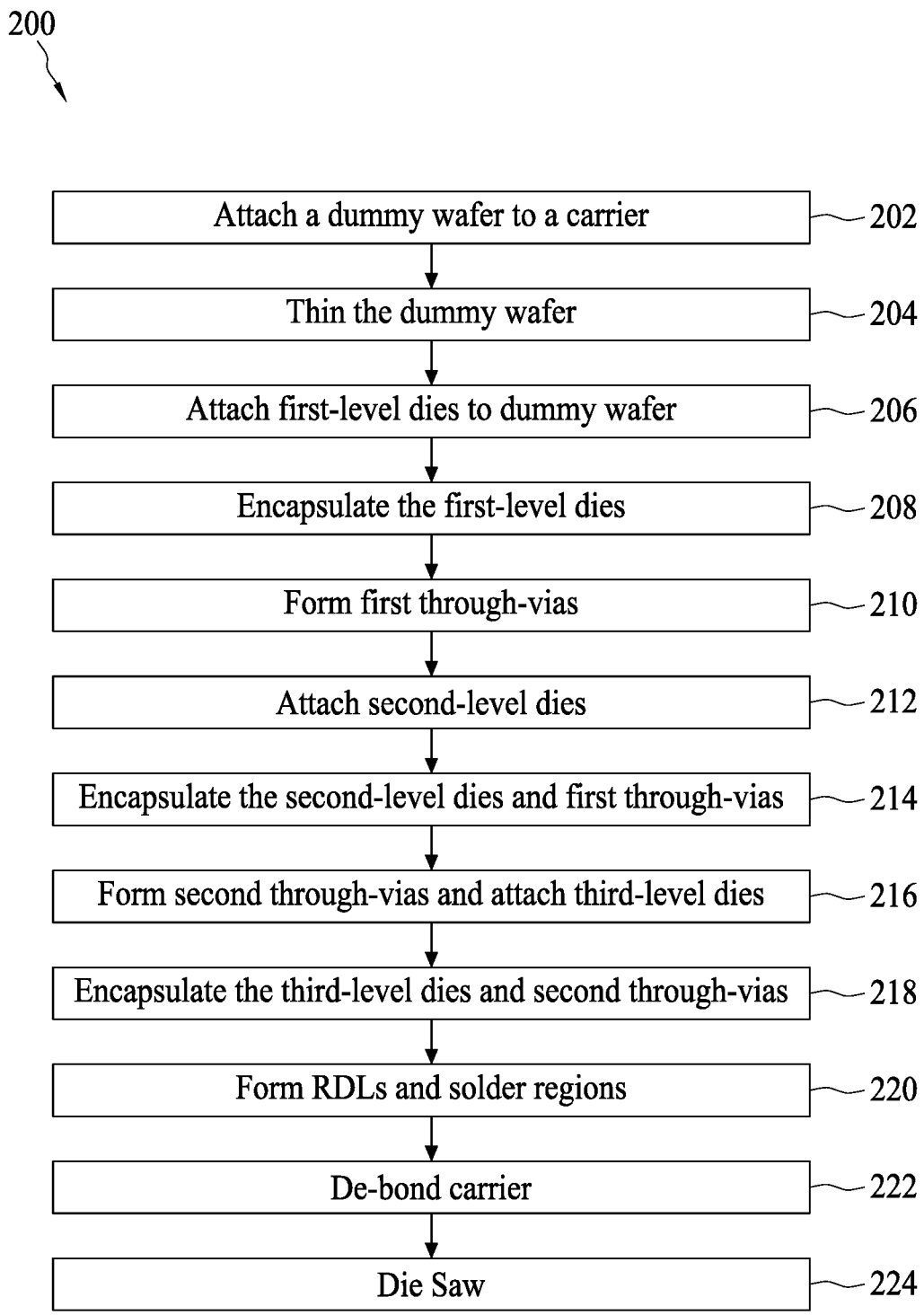
FIG. 23 illustrates a process flow for forming a multi-stacking fan-out package in accordance with some embodiments.

FIGS. 1 through 10 illustrate the cross-sectional views of intermediate stages in the formation of a multi-stacking fan-out package in accordance with some embodiments. The steps shown in FIGS. 1 through 10 are also illustrated schematically in the process flow 200 as shown in FIG. 23.

Referring to FIG. 1, wafer 24 is adhered to carrier 20. The respective step is illustrated as step 202 in the process flow shown in FIG. 23. In accordance with some embodiments of the present disclosure, carrier 20 is a glass carrier. In accordance with other embodiments, carrier 20 is formed of other materials that are rigid. Adhesive film 22 may be used for attaching wafer 24 to carrier 20. Wafer 24 may have a round top-view shape. Wafer 24 is referred to as a dummy wafer throughout the description since it may be a blank wafer with no active devices (such as transistors and diodes) and passive devices (such as resistors, capacitors, and inductors) formed therein. Wafer 24 is formed of a rigid material, which may have a Young's modulus equal to or greater than the Young's modulus of silicon (about 165 GPa to about 179 GPa). Accordingly, dummy wafer 24 may have a Young's modulus equal to or greater than about 165 GPa.

In addition, dummy wafer 24 may have a good thermal conductivity. The thermal conductivity of dummy wafer 24 may be close to (for example, greater than 90 percent of) the thermal conductivity of the semiconductor substrates (such as silicon substrates) in the overlying device dies. For example, silicon has a thermal conductivity equal to about 148 W/(m*K), and hence the thermal conductivity of dummy wafer 24 may be greater than about 135 W/(m*K) or higher. With dummy wafer 24 having a high thermal conductivity, the thermal dissipation in the resulting structure is improved.

In accordance with some embodiments of the present disclosure, dummy wafer 24 is formed of a metal or a metal alloy, a semiconductor material, or a dielectric material. For example, when including metal, dummy wafer 24 may be formed of copper, aluminum, nickel, or the like, and hence is a metal film/plate in accordance with some embodiments. When formed of a semiconductor material, wafer 24 may be a silicon wafer, which may be the same type of wafer on which active devices are formed. When formed of a dielectric material, dummy wafer 24 may be formed of ceramic. In addition, the material of dummy wafer 24 may be homogenous. For example, the entire dummy wafer 24 may be formed of the same material, which includes same elements, and the atomic percentages of the elements may be uniform throughout dummy wafer 24. In accordance with some exemplary embodiments, dummy wafer 24 is formed of silicon, with a p-type or an n-type impurity doped in dummy wafer 24. In accordance with alternative embodiments, no p-type impurity and n-type impurity are doped in dummy wafer 24.

Figure 2:
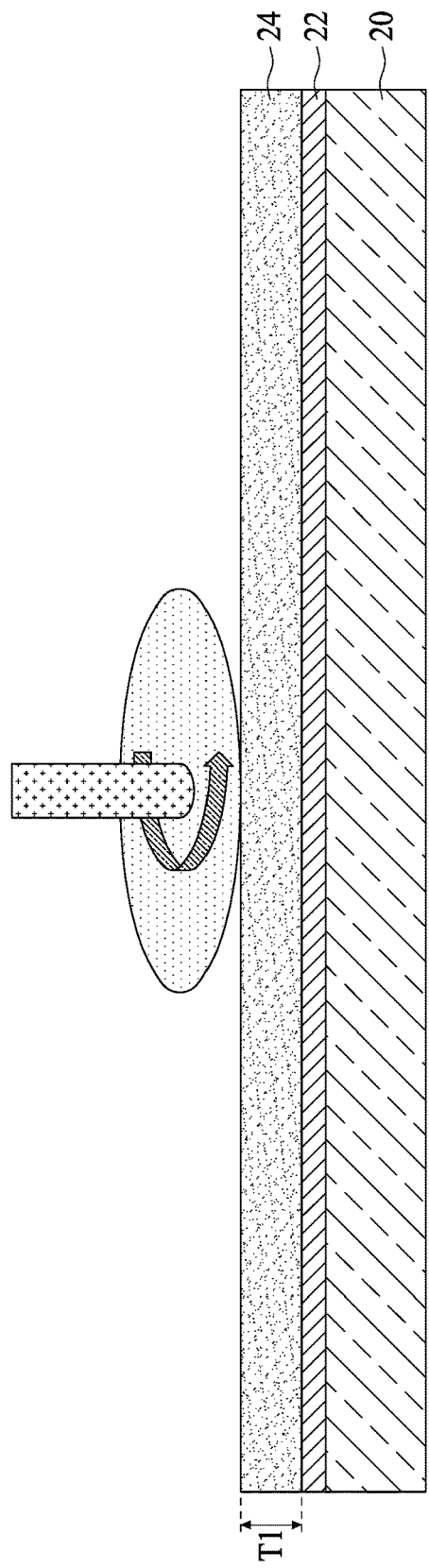

Referring to FIG. 2, dummy wafer 24 may be thinned, for example, in a grinding process. The respective step is illustrated as step 204 in the process flow shown in FIG. 23. The resulting thickness T1 of dummy wafer 24 is great enough so that dummy wafer 24 may provide adequate mechanical support to the overlying structures, which are built in subsequent steps.

Figure 3:
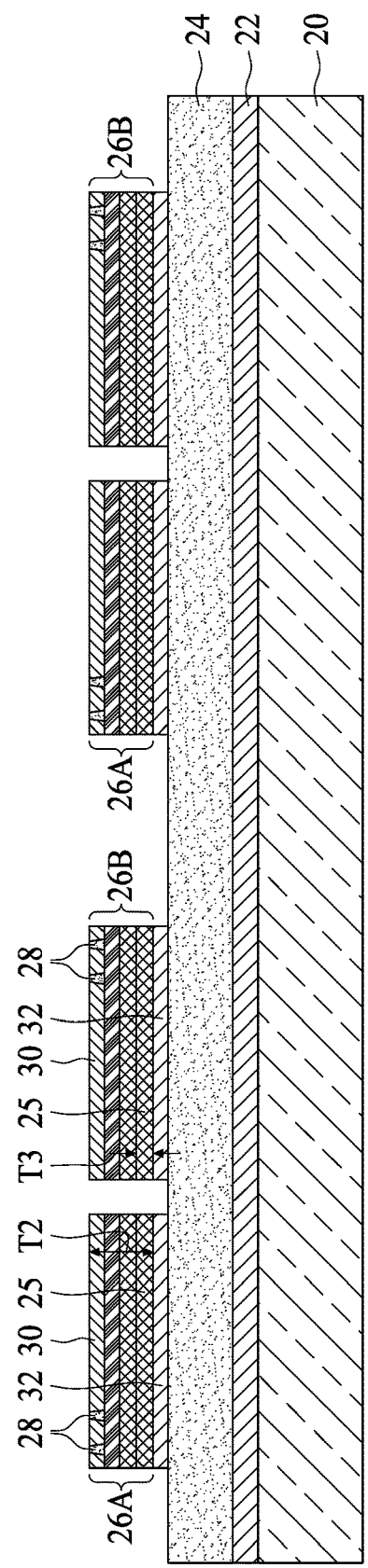

Referring to FIG. 3, device dies 26 (including 26A and 26B) are adhered to dummy wafer 24 through Die Attach Films (DAFs) 32. The respective step is illustrated as step 206 in the process flow shown in FIG. 23. Throughout the description, device dies 26 are referred to as a first-level device dies. The edges of DAFs 32 are co-terminus with (aligned to) the respective edges of device dies 26. In accordance with some embodiments of the present disclosure, device dies 26 are memory dies, which may be Dynamic Random Access Memory (DRAM) dies, Negative-AND (NAND) dies, Static Random Access Memory (SRAM) dies, Double-Data-Rate (DDR) dies, or the like. Device dies 26 may also be logic device dies or integrated passive device dies (with no active devices therein). Each of device dies 26 may be a single memory die or a memory die stack. Also, device dies 26 also include semiconductor substrates 25, wherein active devices (not shown) such as transistors and/or diodes are formed at the top surfaces of semiconductor substrates. The back surfaces of device dies 26, which may also be the back surfaces of semiconductor substrates 25, are in contact with DAFs 32.

Device dies 26 have thicknesses T2, and semiconductor substrates 25 in device dies 26 have thickness T3. In accordance with some embodiments, thickness T1 of dummy wafer 24 is equal to or greater than thickness T3 of semiconductor substrates 25. Thickness T1 may also be equal to or greater than thickness T2 of device dies 26. Dummy wafer 24 has the function of providing mechanical support to the overlying structure. Accordingly, the material of dummy wafer 24 is selected to be thick and rigid enough. For example, thickness T1 of dummy wafer 24 is desirably to be greater than thickness T3 or T2 to provide enough mechanical support.

In accordance with some embodiments, device dies 26 include electrical connectors 28, which may be metal pillars or metal pads. Electrical connectors 28 are electrically coupled to the integrated circuits (not shown) inside device dies 26. Electrical connectors 28 may be copper pillars, and may also include other conductive/metallic materials such as aluminum, nickel, or the like. In accordance with some exemplary embodiments of the present disclosure, electrical connectors 28 are in dielectric layers 30, with the top surfaces of dielectric layers 30 being higher than or coplanar with the top surfaces of electrical connectors 28. Dielectric layers 30 further extend into the gaps between electrical connectors 28. Dielectric layers 30 may be formed of a polymer such as polybenzoxazole (PBO) or polyimide in accordance with some exemplary embodiments.

Electrical connectors 28 may be offset from the centers of respective device dies 26. For example, the electrical connectors 28 of the left-side device die 26 (marked as 26A) are disposed on the left side of device die 26A, while no electrical connector 28 is formed either close to the center or on the right side of device die 26A. The electrical connectors 28 of the right-side device die 26 (marked as 26B), on the other hand, are disposed on the right side of device die 26B, while no electrical connector 28 is formed either close to the center or on the left side of device die 26B.

Figure 4:
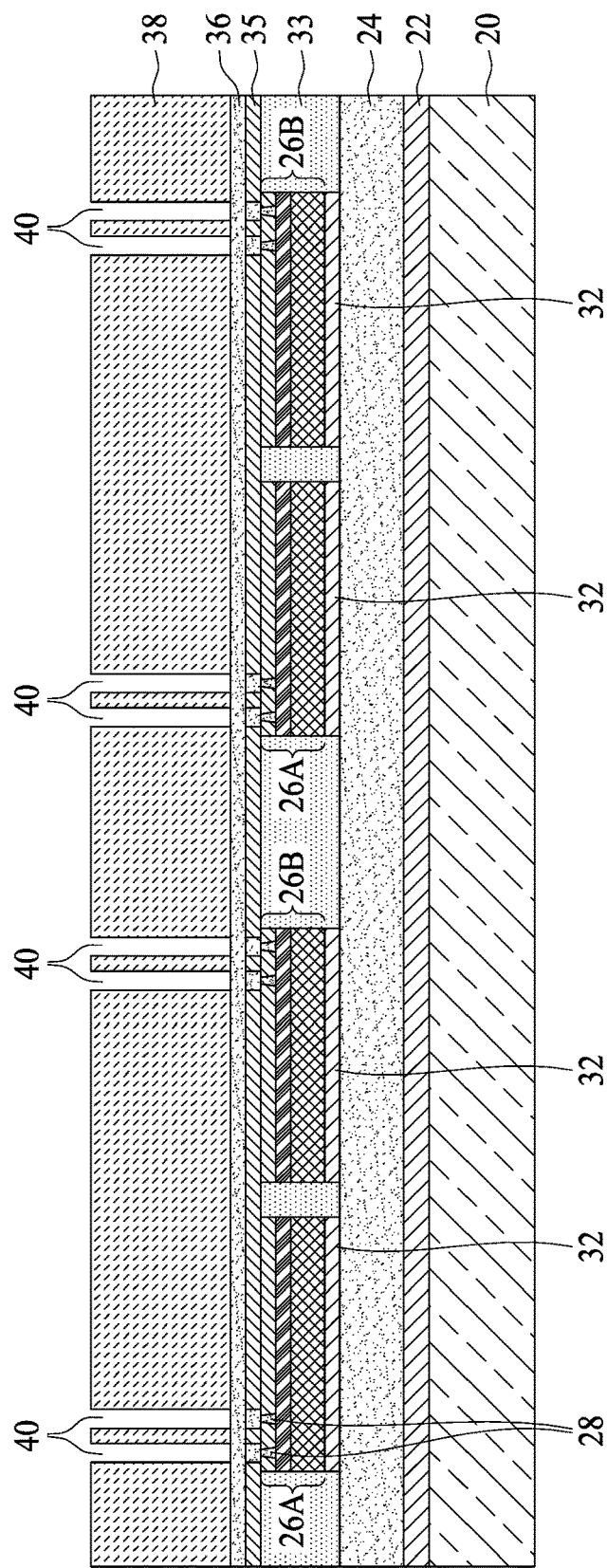

FIG. 4 illustrates the encapsulation of encapsulating material 33, which may be a molding compound, a molding underfill, a resin, or the like in accordance with some embodiments. The respective step is illustrated as step 208 in the process flow shown in FIG. 23. Encapsulating material 33 is dispensed as a fluid and then being compressed and cured, for example, in a thermal curing process. Encapsulating material 33 fills the gaps between device die 26. After the encapsulating process, the top surface of encapsulating material 33 is higher than the top ends of electrical connectors 28. Next, a planarization step such as a mechanical grinding, a Chemical Mechanical Polish (CMP) and/or a combination of both is performed to planarize encapsulating material 33 and electrical connectors 28.

In accordance with some embodiments, as shown in FIG. 4, dielectric layer 35 is formed over device dies 26 and encapsulating material 33. Dielectric layer 35 may be formed of a polymer such as PBO, polyimide, BCB, or the like. Dielectric layer 35 is then patterned to expose the underlying electrical connectors 28. Next, seed layer 36 is formed. Seed layer 36 may include a titanium layer and a copper layer over the titanium layer. Seed layer 36 extends into the openings in dielectric layer 35 to contact, and electrically coupling to, electrical connectors 28.

Figure 5:
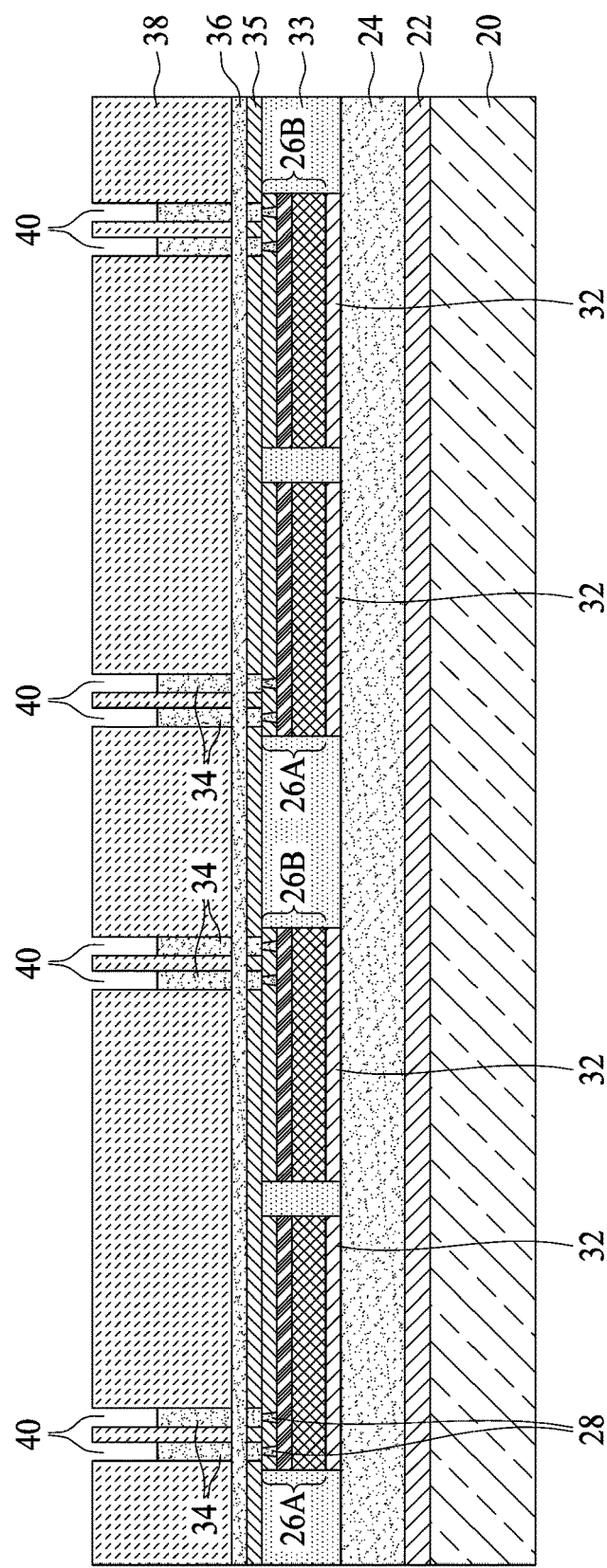
Figure 6:
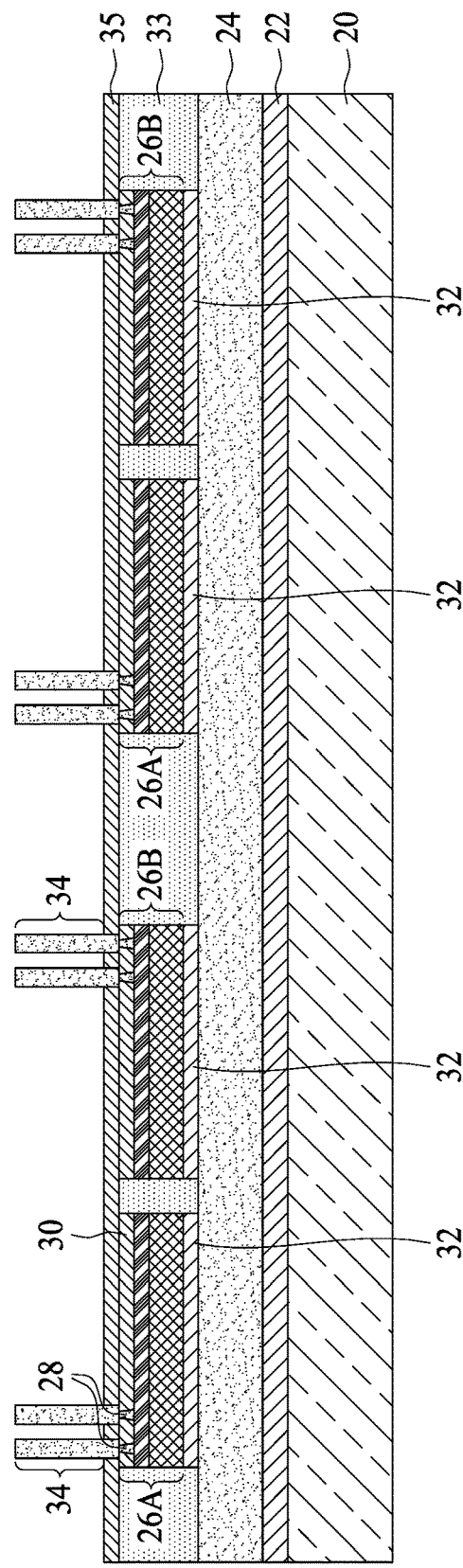

FIGS. 4 through 6 further illustrate the formation of through-vias 34. The respective step is illustrated as step 210 in the process flow shown in FIG. 23. Referring to FIG. 4, mask layer 38 is formed over seed layer 36, and is then patterned to form openings 40, through which some portions of seed layer 36 are exposed.

As shown in FIG. 5, through-vias 34 are formed in openings 40 through plating. Mask layer 38 is then removed, resulting in the structure in FIG. 6. In accordance with some embodiments of the present disclosure, after the removal of mask layer 38, the portions of seed layer 36 not directly underlying through-vias 34 are removed in an etching process. The remaining portions of seed layer 36 thus become the bottom portions of through-vias 34. Throughout the description, through-vias 34 refer to the portions of the plated material and seed layer 36 protruding higher than the top surface of dielectric layer 35. The portions of the plated conductive material and seed layer extending into dielectric layer 35 are referred to as vias, which connect the overlying through-vias 34 to the underlying electrical connectors 28.

Figure 7:
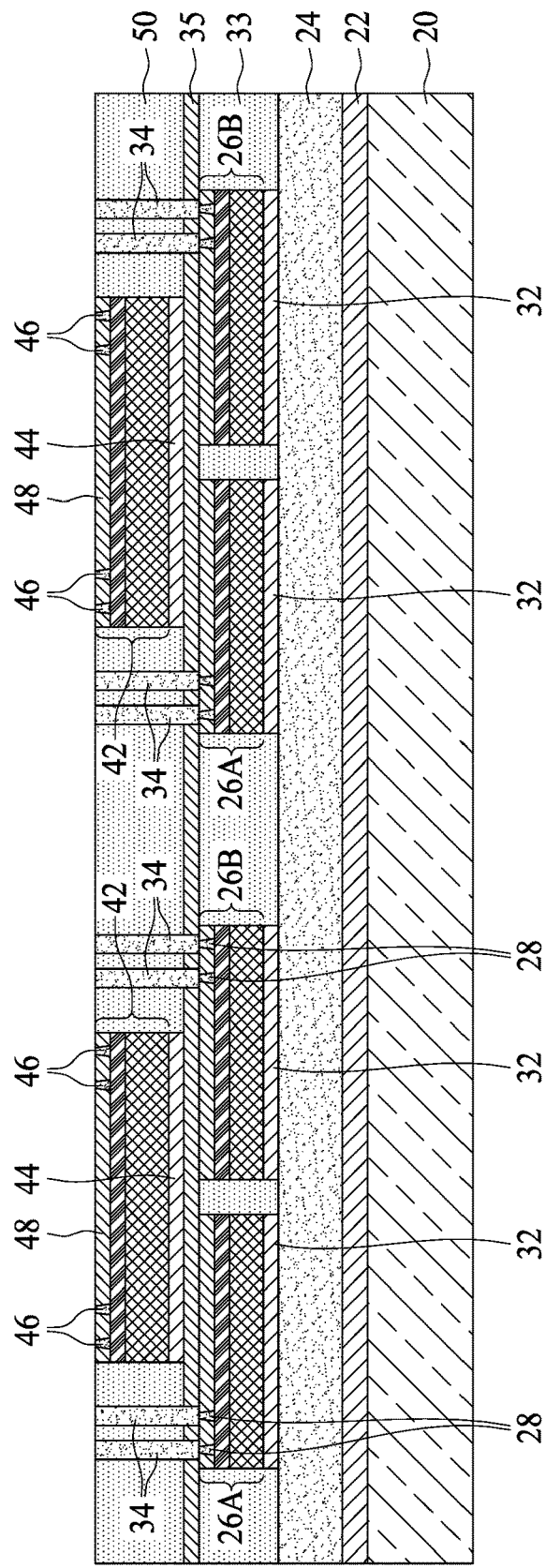

Next, referring to FIG. 7, device dies 42 are attached to dielectric layer 35 through DAFs 44, wherein the back surface of device dies 42 are attached to the front surfaces of device dies 26. Throughout the description, device dies 42 are referred to as second-level device dies. The respective step is illustrated as step 212 in the process flow shown in FIG. 23. Device dies 42 may include electrical connectors 46 embedded in the respective dielectric layers 48, wherein dielectric layers 48 may be formed of a polymer such as PBO, polyimide, BCB, or the like.

Device dies 42 may be DRAM dies, NAND dies, SRAM dies, DDR dies, or the like. Device dies 42 may also be logic device dies or integrated passive device dies (with no active devices therein). Furthermore, device dies 42 and device dies 26 may be the same type of dies (for example, both are DRAM dies), or may be different types of dies. As shown in FIG. 7, the first-level device dies 26 may have electrical connectors 28 offset from the centers of the respective dies, and hence second-level device dies 42 may overlap device dies 26. Using the device die 42 on the left side of FIG. 7 as an example, device die 42 overlaps the right portion of the respective underlying device die 26A and the left portion of the respective underlying device die 26B.

In a subsequent step, encapsulating material 50, which may be a molding compound, a molding underfill, a resin, or the like is encapsulated on through-vias 34 and device dies 42. The respective step is illustrated as step 214 in the process flow shown in FIG. 23. Next, a planarization step such as a mechanical grinding, CMP or a combination of both is performed to planarize encapsulating material 50 and device dies 42, so that electrical connectors 46 and through-vias 34 are exposed. In the resulting structure, through-vias 34 penetrate through encapsulating material 50.

Figure 8:
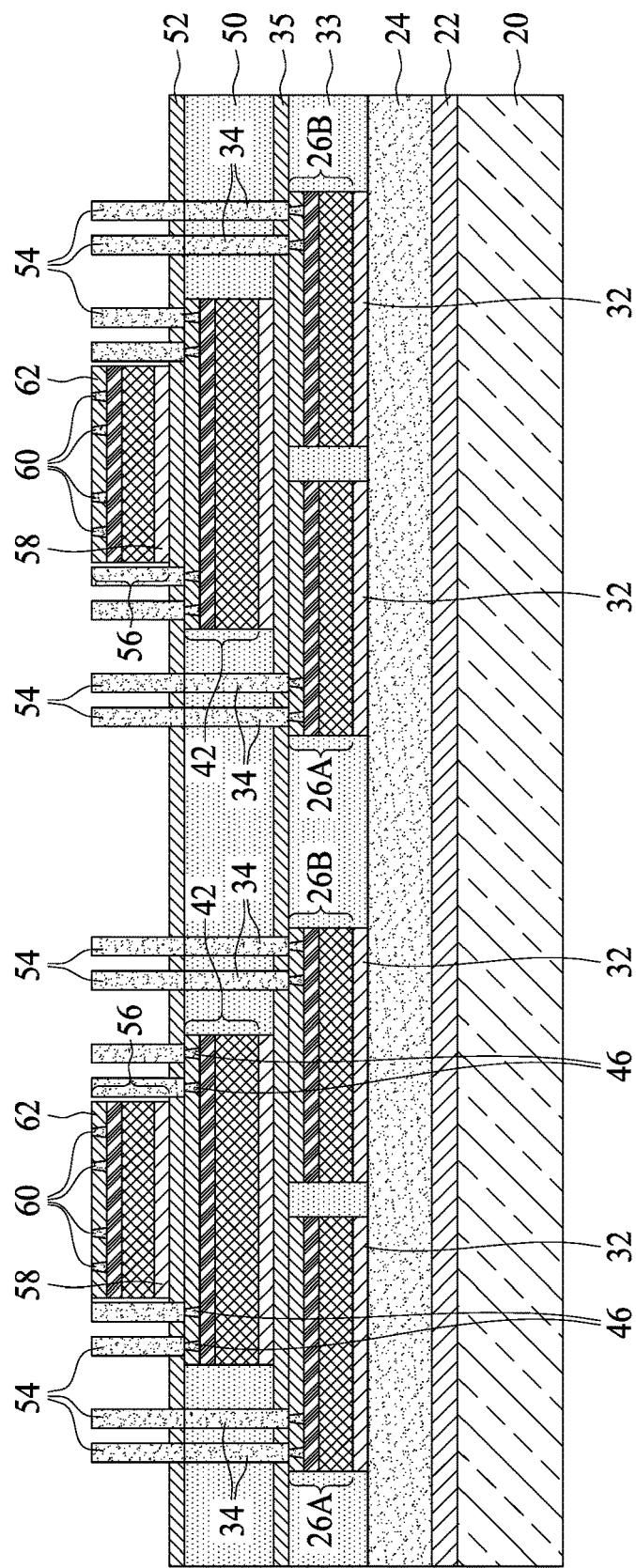

FIG. 8 illustrates the formation of dielectric layer 52 and through-vias 54. The respective step is illustrated as step 216 in the process flow shown in FIG. 23. In the respective formation process, dielectric layer 52 is first formed, followed by the patterning of dielectric layer 52 to expose the underlying electrical connectors 46 and through-vias 34. Dielectric layer 52 may be formed of PBO, polyimide, BCB, or the like. Next, through-vias 54 are formed. The formation steps of through-vias 54 may be similar to the process steps shown in FIGS. 4, 5, and 6, and hence are not repeated herein.

As also shown in FIG. 8, device dies 56 are attached to dielectric layer 52 through DAFs 58. Device dies 56 are also referred to as third-level device dies throughout the description. The respective step is also illustrated as step 216 in the process flow shown in FIG. 23. In accordance with some embodiments of the present disclosure, device dies 56 are System on Chip (SoC) dies. Device dies 56 may be logic dies, which may be Central Processing Unit (CPU) dies, Micro Control Unit (MCU) dies, Input-Output (IO) dies, BaseBand (BB) dies, or Application processor (AP) dies. Although not shown, device dies 56 include semiconductor substrates, wherein active devices such as transistors and/or diodes are formed at the top surfaces of the semiconductor substrates. Furthermore, metal lines and vias (not shown) are formed in interconnect structures (not shown), which are over the respective semiconductor substrates, to interconnect the integrated circuit devices in device dies 56. Device dies 56 further include electrical connectors 60 embedded in the respective dielectric layers 62, wherein the materials of electrical connectors 60 and dielectric layers 62 may be similar to the materials of electrical connectors 28 and dielectric layers 30, respectively.

Figure 9:
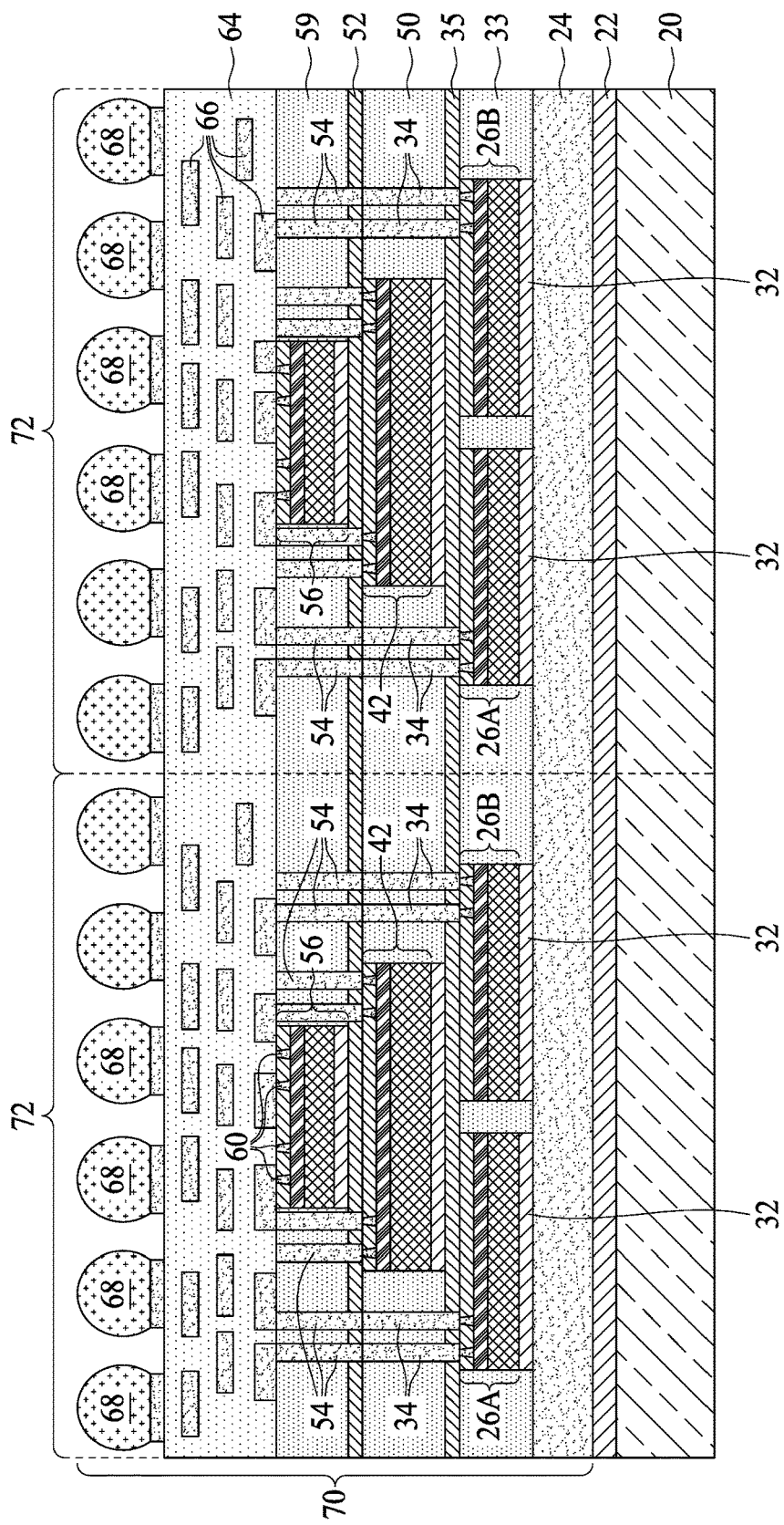

Referring to FIG. 9, encapsulating material 59, which may be a molding compound, a molding underfill, a resin, or the like is encapsulated on through-vias 54 and device dies 56. The respective step is illustrated as step 218 in the process flow shown in FIG. 23. Next, a planarization step is performed to planarize encapsulating material 59 and device dies 56, so that electrical connectors 60 and through-vias 54 are exposed.

Further referring to FIG. 9, one or more dielectric layer(s) 64 and the respective Redistribution Lines (RDLs) 66 are formed over encapsulating material 59, through-vias 54, and device dies 56. In accordance with some embodiments of the present disclosure, dielectric layers 64 are formed of a polymer(s) such as PBO, polyimide, BCB, or the like.

RDLs 66 are formed in dielectric layers 64. The respective step is illustrated as step 220 in the process flow shown in FIG. 23. RDLs 66 are connected to the respective underlying electrical connectors 60 and/or through-vias 54. RDLs 66 may also connect some electrical connectors 60 to through-vias 54. RDLs 66 may include metal traces (metal lines) and vias underlying and connected to the metal traces. In accordance with some embodiments of the present disclosure, RDLs 66 are formed through plating processes, wherein each of RDLs 66 includes a seed layer (not shown) and a plated metallic material over the seed layer. The seed layer and the plated metallic material may be formed of the same material or different materials.

FIG. 9 further illustrates the formation of electrical connectors 68 in accordance with some exemplary embodiments of the present disclosure. The respective step is also illustrated as step 220 in the process flow shown in FIG. 23. Electrical connectors 68 are electrically coupled to RDLs 66, electrical connectors 60, and/or through-vias 54. The formation of electrical connectors 68 may include placing solder balls over RDLs 66 and then reflowing the solder balls. In accordance with alternative embodiments of the present disclosure, the formation of electrical connectors 68 includes performing a plating step to form solder regions over RDLs 66, and then reflowing the solder regions. Electrical connectors 68 may also include metal pillars, or metal pillars and solder caps, which may also be formed through plating. Throughout the description, the portions of the structure over adhesive film 22 are in combination referred to as composite wafer 70.

Figure 10:
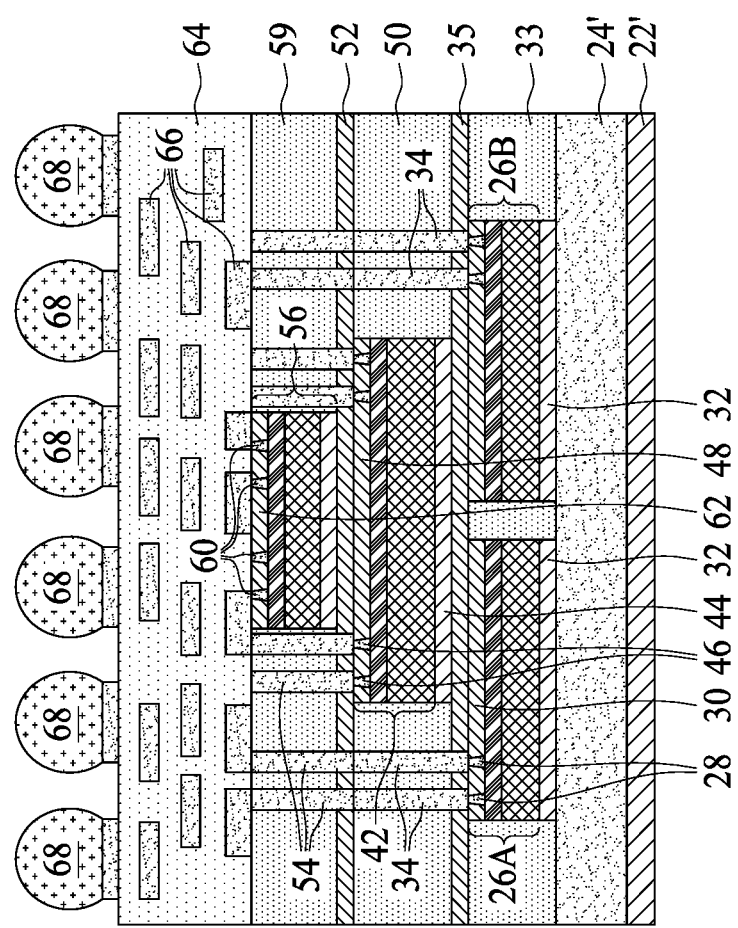

In subsequent steps, carrier 20 is de-bonded from composite wafer 70. The respective step is illustrated as step 222 in the process flow shown in FIG. 23. Composite wafer 70 is sawed apart into a plurality of packages 72, wherein one of packages 72 is shown in FIG. 10. The respective step is illustrated as step 224 in the process flow shown in FIG. 23.

Referring to FIG. 10, package 72 is a multi-level (multi-stacking) package including two levels, three levels, or more levels of device dies. Furthermore, there may be multiple levels of through-vias and encapsulating materials. Dummy wafer 24 and DAF 22 are sawed into dummy dies 24' and DAFs 22' respectively.

FIGS. 11 through 14 illustrate cross-sectional views of intermediate stages in the formation of a multi-level package in accordance with some embodiments of the present disclosure. Unless specified otherwise, the materials and the formation methods of the components in these embodiments are essentially the same as the like components, which are denoted by like reference numerals in the embodiments shown in FIGS. 1 through 10. The details regarding the formation process and the materials of the components shown in FIGS. 11A through 14 (and FIGS. 15 through 21) may thus be found in the discussion of the embodiments shown in FIGS. 1 through 10.

Figure 11A:
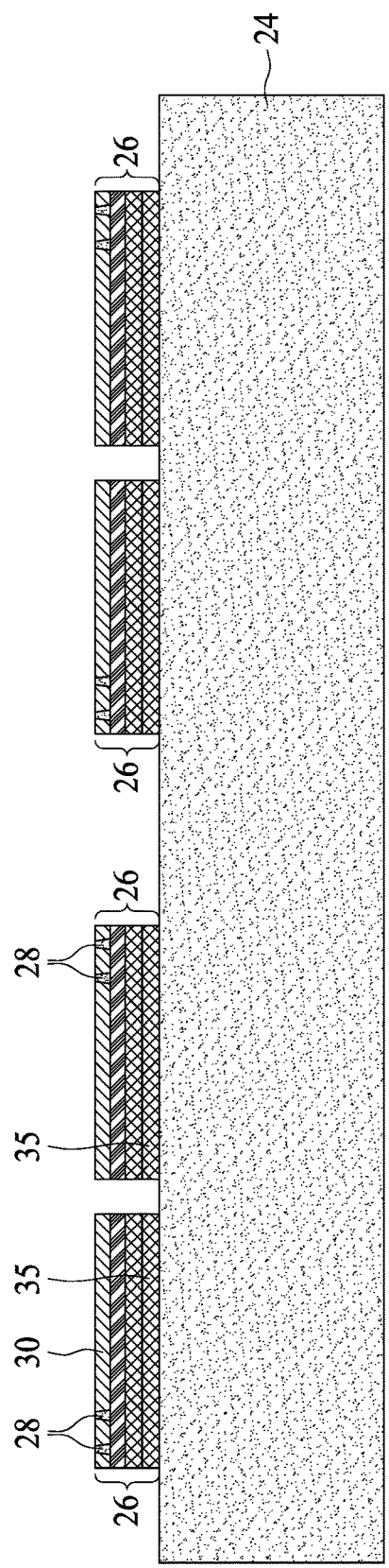
FIGS. 11A, 11B, and 12 through 14 illustrate the cross-sectional views of intermediate stages in the formation of a multi-stacking fan-out package in accordance with some embodiments.
Figure 11B:
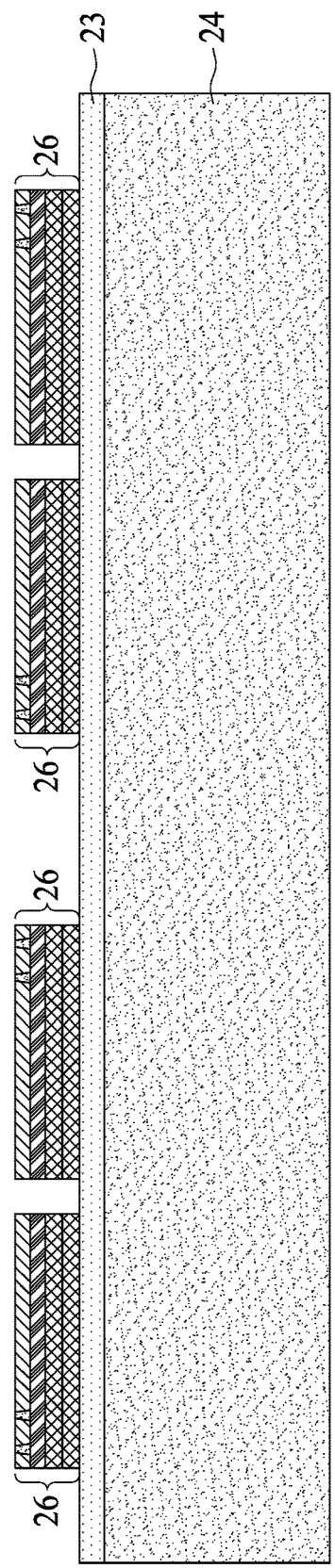

The embodiments shown in FIGS. 11A through 14 are similar to the embodiments in FIGS. 1 through 10, except no carrier is used, and the bonding of the first-level device dies 26 to dummy wafer 24 may be through direct bonding rather than through DAFs. FIG. 11A illustrates the bonding of device dies 26 onto dummy wafer 24. Dummy wafer 24 is a thick wafer that has not been thinned yet. Accordingly, carrier may not be used in accordance with some embodiments, although a carrier may also be used. Device dies 26 include semiconductor substrates 25, which may be silicon substrates. In accordance with some embodiments of the present disclosure, the back surfaces of substrates 25 are in direct bond with dummy wafer 24, which may be a silicon wafer. The bonding may form Si—Si bonds. FIG. 11B illustrates the bonding in accordance with alternative embodiments, wherein silicon oxide layer 23 is formed as the top surface portion of dummy wafer 24, for example, through thermal oxidation of dummy wafer 24. Semiconductor substrates 25 of device dies 26 are bonded to dielectric layer 23 (which may be a silicon oxide layer) through fusion bonding. In accordance with some embodiments, Si—O—Si bonds are formed to bond substrates 25 to dielectric layer 23.

Figure 12:
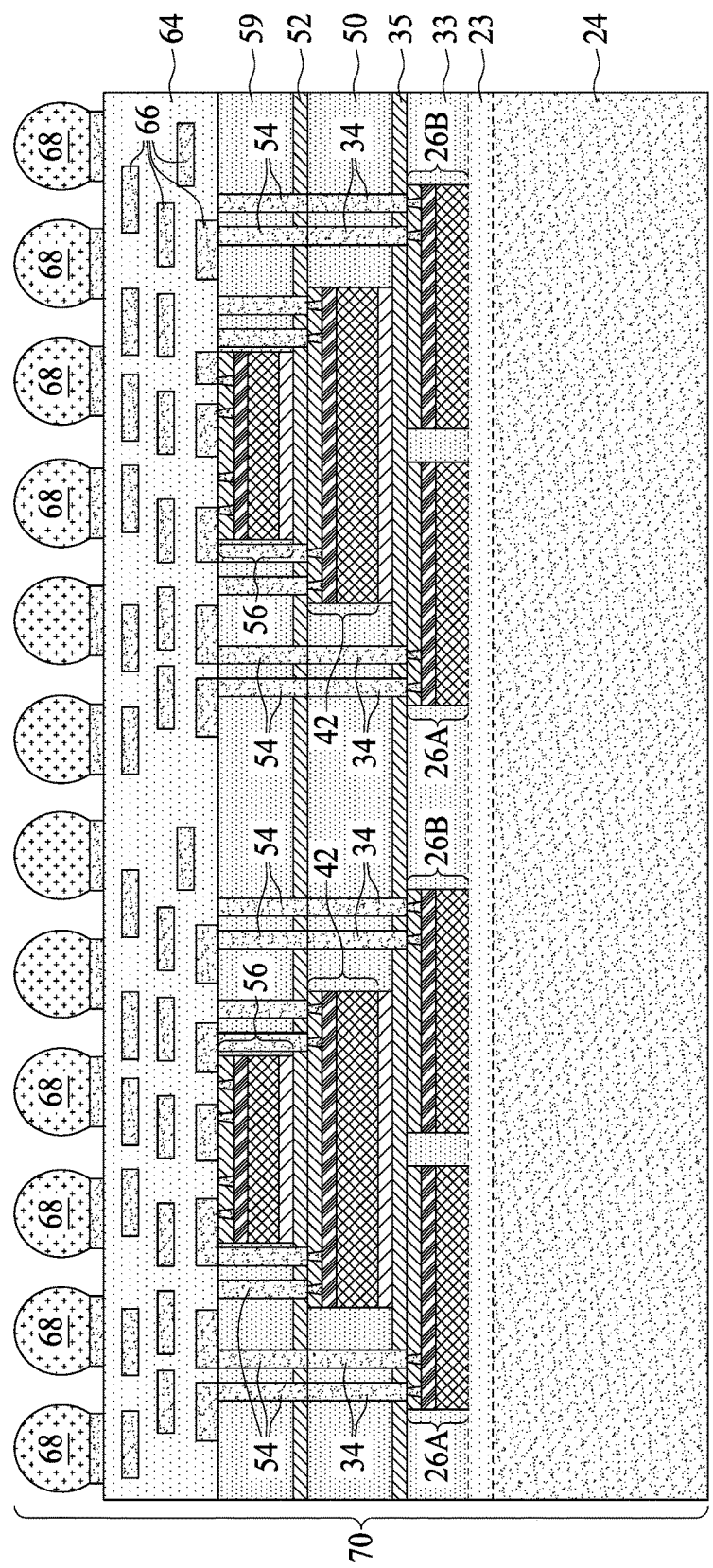

The subsequent process steps in accordance with these embodiments are similar to what are shown in FIG. 4 through 9, and the processes and materials may be found referring to the embodiments of FIGS. 4 through 9. The resulting structure is shown in FIG. 12. In FIG. 12, dielectric layer 23 is illustrated using dashed lines to indicate it may or may not exist. Composite wafer 70, which includes dummy wafer 24 and the overlying device dies, encapsulating materials, through-vias, etc., is thus formed.

Figure 13:
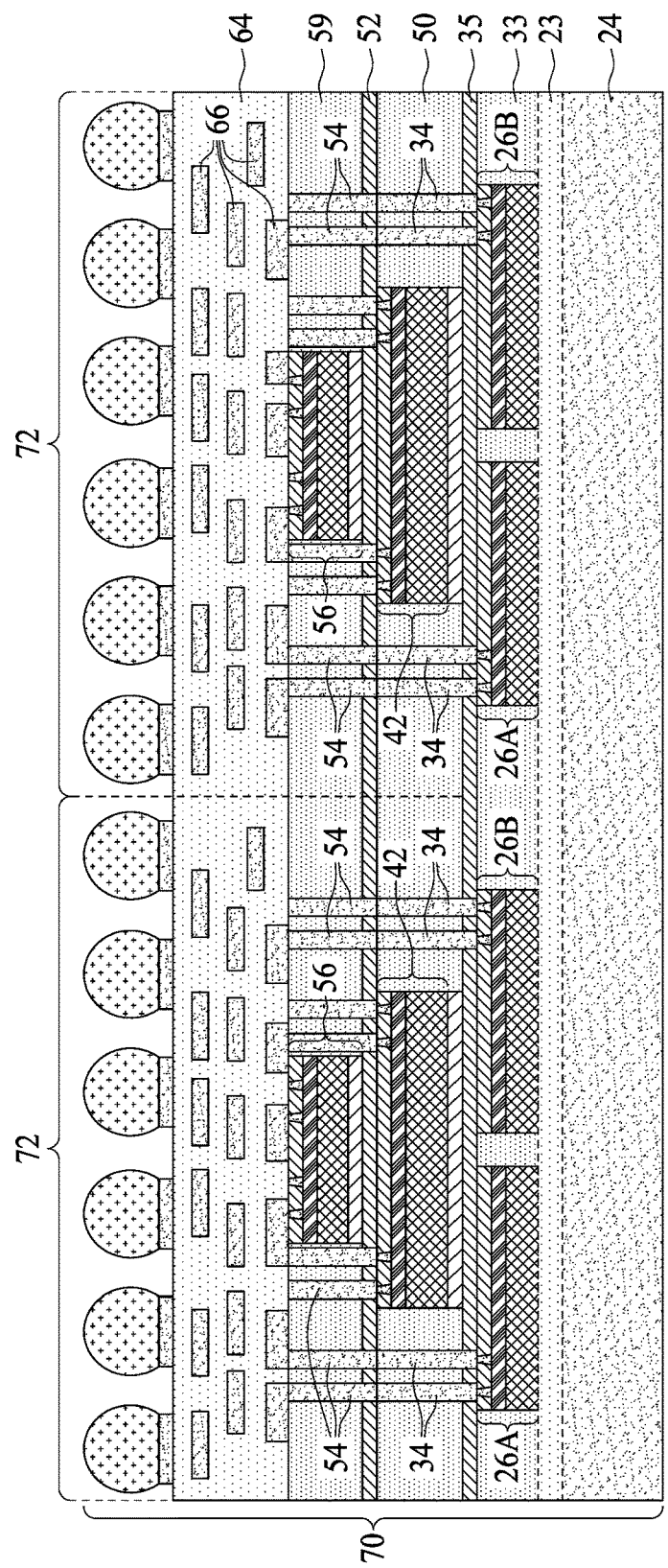
Figure 14:
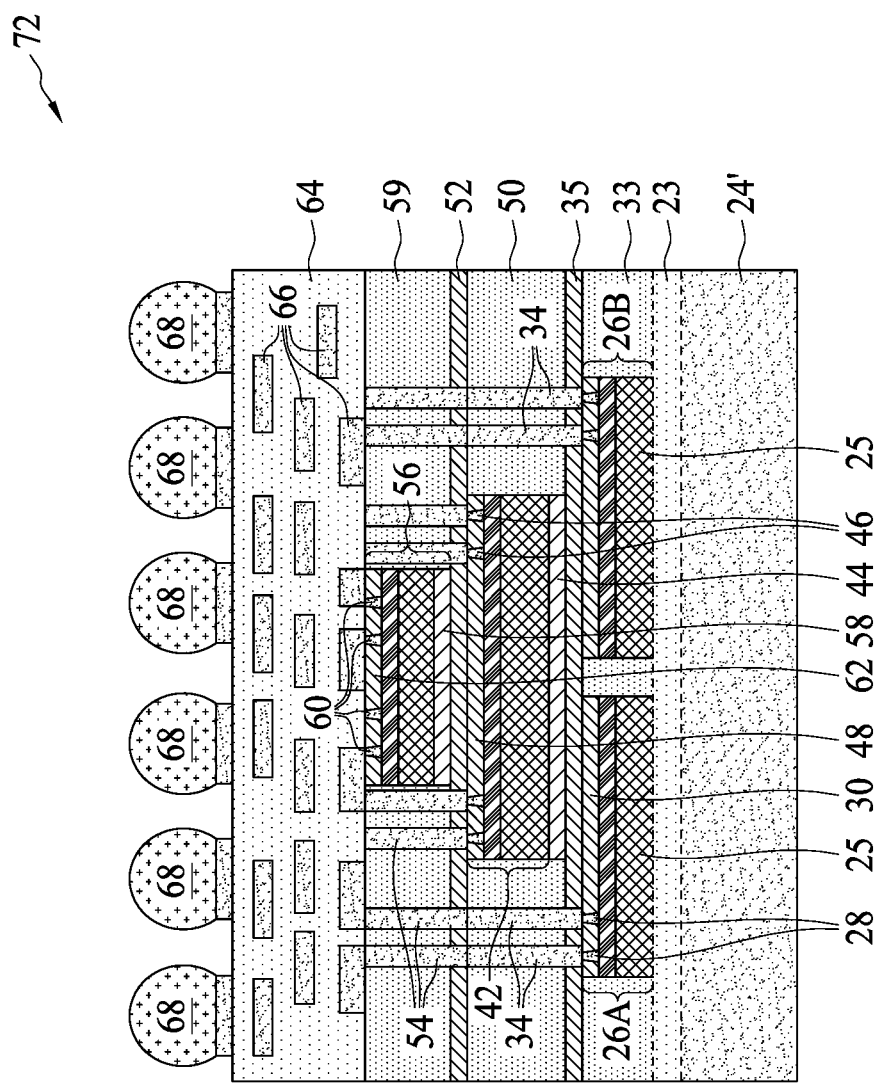

FIG. 13 illustrates the thinning of dummy wafer 24, for example, through mechanical grinding. In a subsequent step, composite wafer 70 is sawed into packages 72, wherein one of packages 72 is shown in FIG. 14.

FIGS. 15 through 21 illustrate the cross-sectional views of intermediate stages in the formation of a multi-level package in accordance with some embodiments of the present disclosure. These embodiments are similar to the embodiments shown in FIGS. 1 through 10, except that instead of using a dummy wafer, discrete dummy dies are used.

Figure 15:
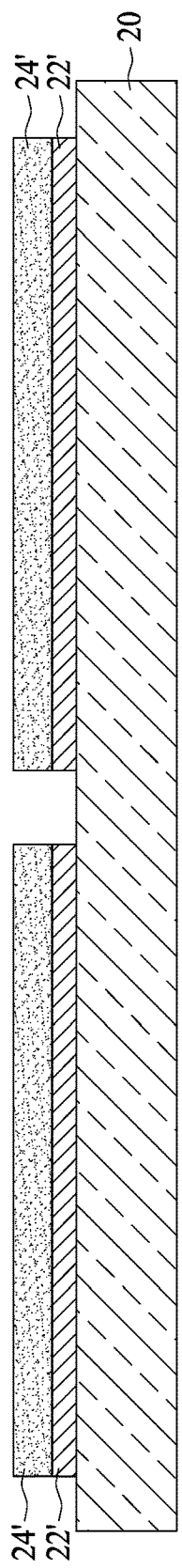
FIGS. 15 through 21 illustrate the cross-sectional views of intermediate stages in the formation of a multi-stacking fan-out package in accordance with some embodiments.
Figure 16:
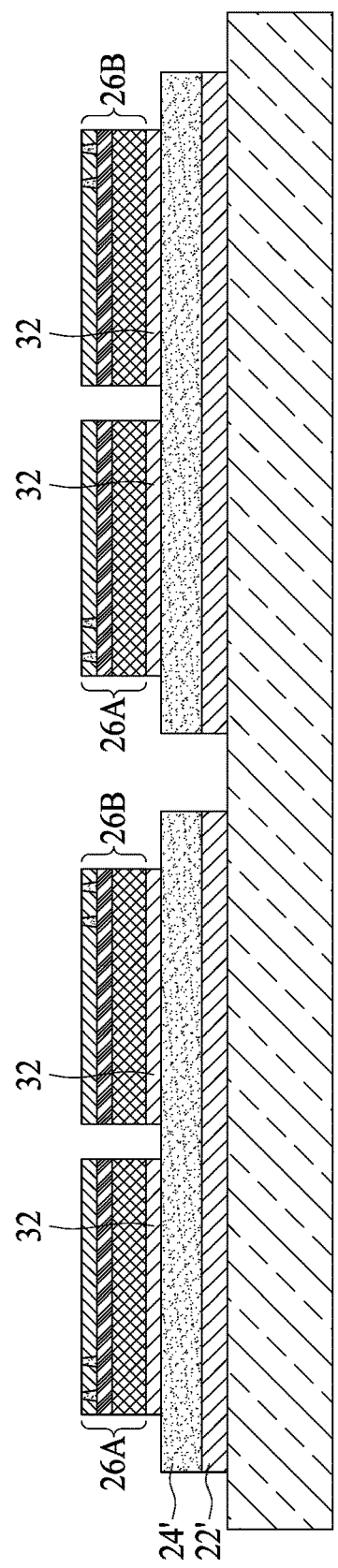
Figure 17:
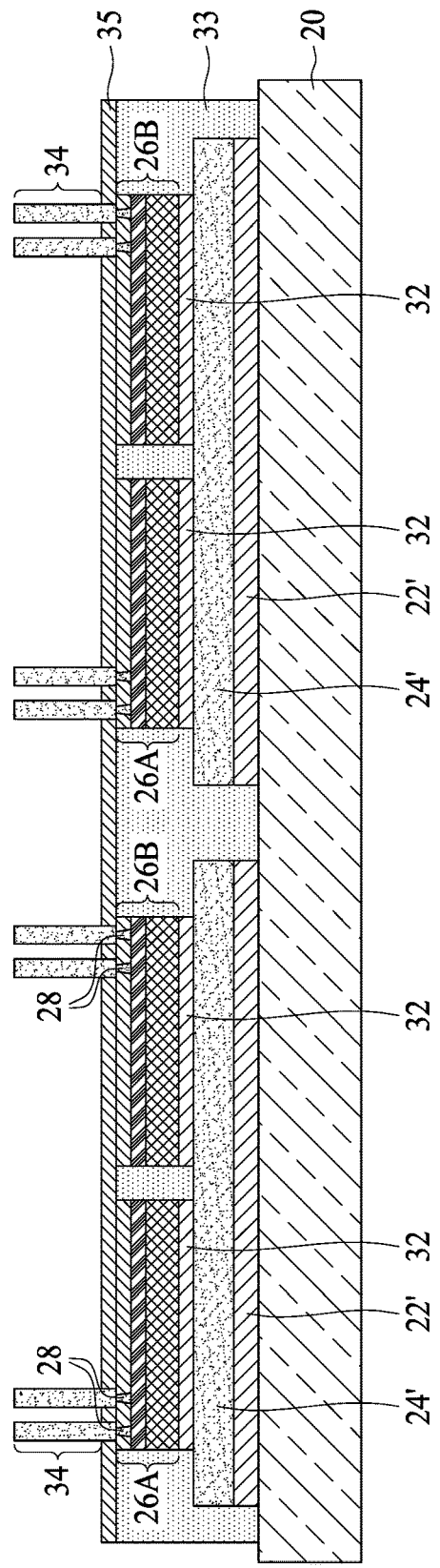
Figure 18:
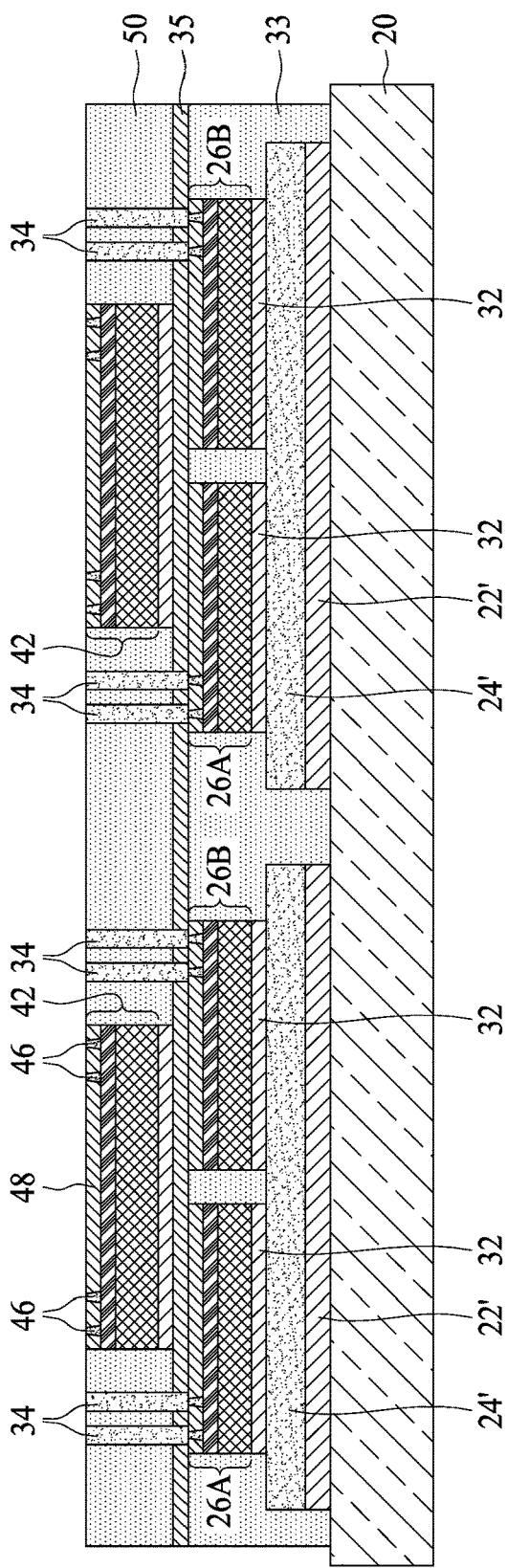
Figure 19:
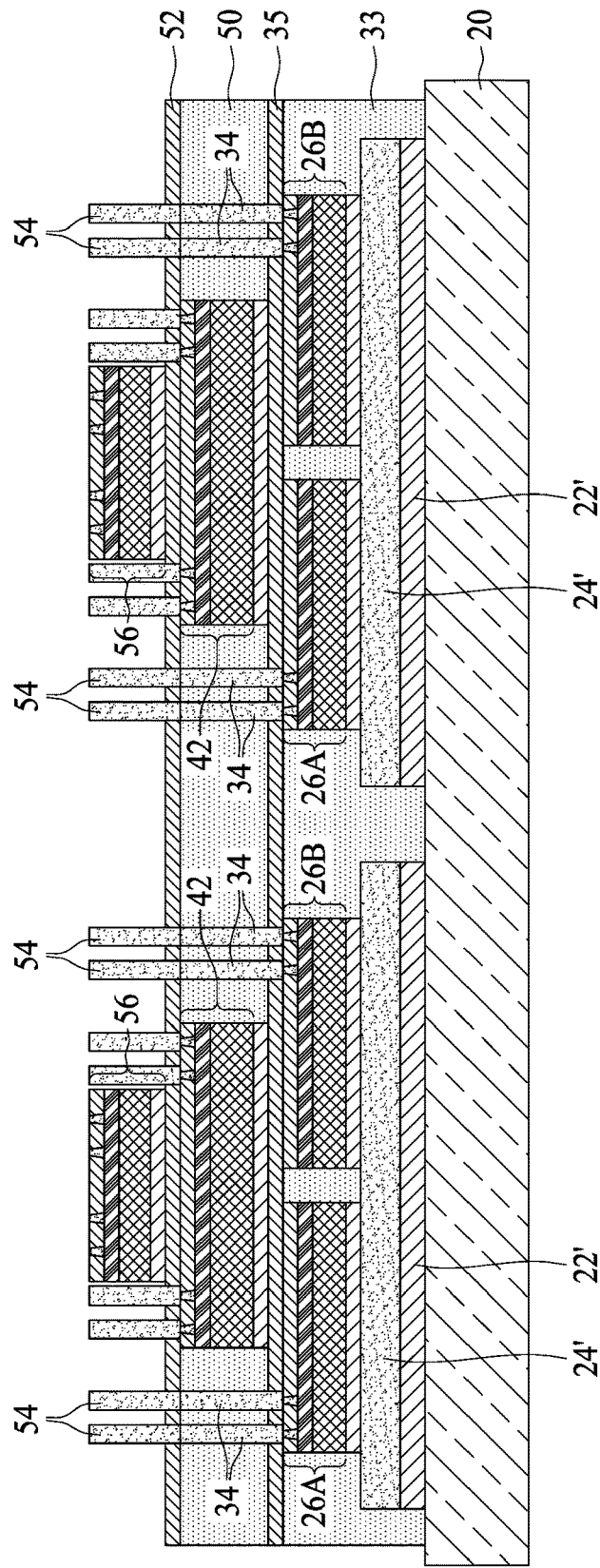
Figure 20:
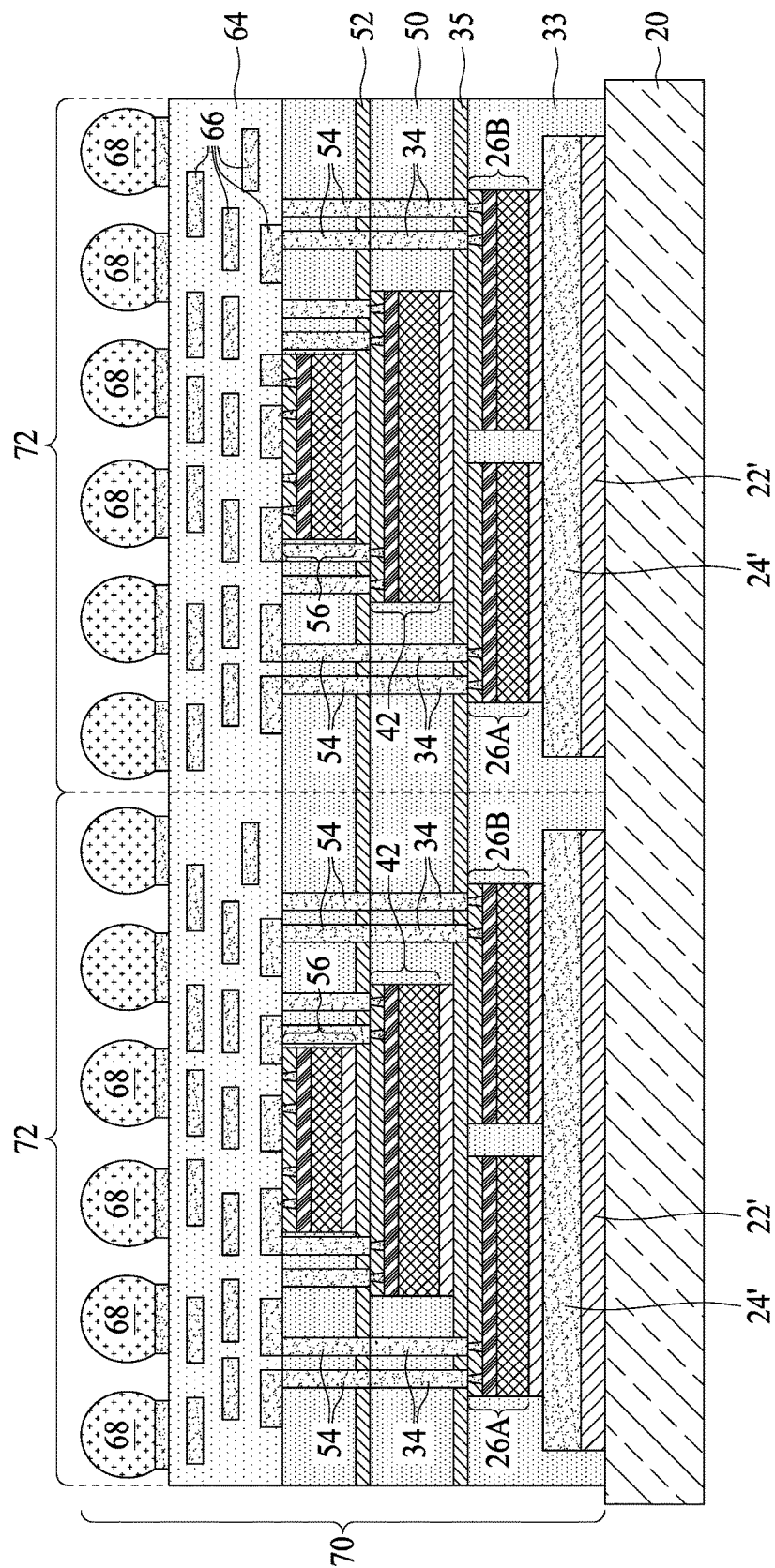

Referring to FIG. 15, dummy dies 24' are attached to carrier 20 through DAFs 22'. Dummy dies 24' and the respective underlying adhesive films 22' are pre-cut as small pieces. The material of dummy dies 24' may be selected from the same candidate materials of dummy wafer 24 (FIG. 1). In accordance with some embodiments, dummy dies 24' are obtained by sawing dummy wafer 24 that may be used in the embodiments shown in FIGS. 1 through 10. Carrier 20 may have a round top-view shape, and dummy dies 24' may be arranged as an array. The subsequent process steps, which are shown in FIGS. 16, 17, 18, and 19 in accordance with some embodiments are similar to what are shown in FIG. 4 through 9, and the respective processes and materials may be found referring to the embodiments shown in FIGS. 4 through 9. The resulting structure is shown in FIG. 20. In FIG. 20, the portions of the structure over carrier 20 are in combination referred to as composite wafer 70 hereinafter.

Figure 21:
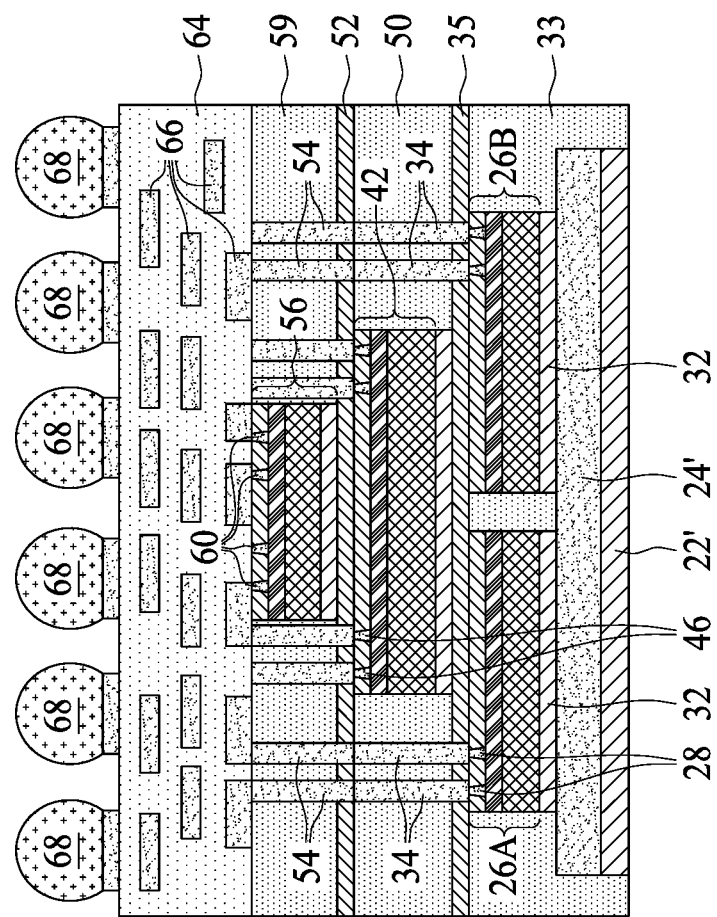

Next, carrier 20 is de-bonded from composite wafer 70, followed by performing a die-saw on composite wafer 70. In the resulting package 72, as shown in FIG. 21, encapsulating material 33 extends to a level lower than the bottom surface of dummy die 24', and encircles dummy die 24'. Encapsulating material 33 may also encircle DAF 22'. In accordance with some embodiments of the present disclosure, the bottom surface of encapsulating material 33 is coplanar with the bottom surface of DAF 22'. In accordance with some embodiments, after the de-bonding of carrier 20 and before the die-saw, a backside grinding is performed to remove adhesives 22', so that dummy dies 24' may be exposed. In the resulting package 72, the bottom surface of encapsulating material 33 is coplanar with the bottom surface of dummy die 24'.

Figure 22:
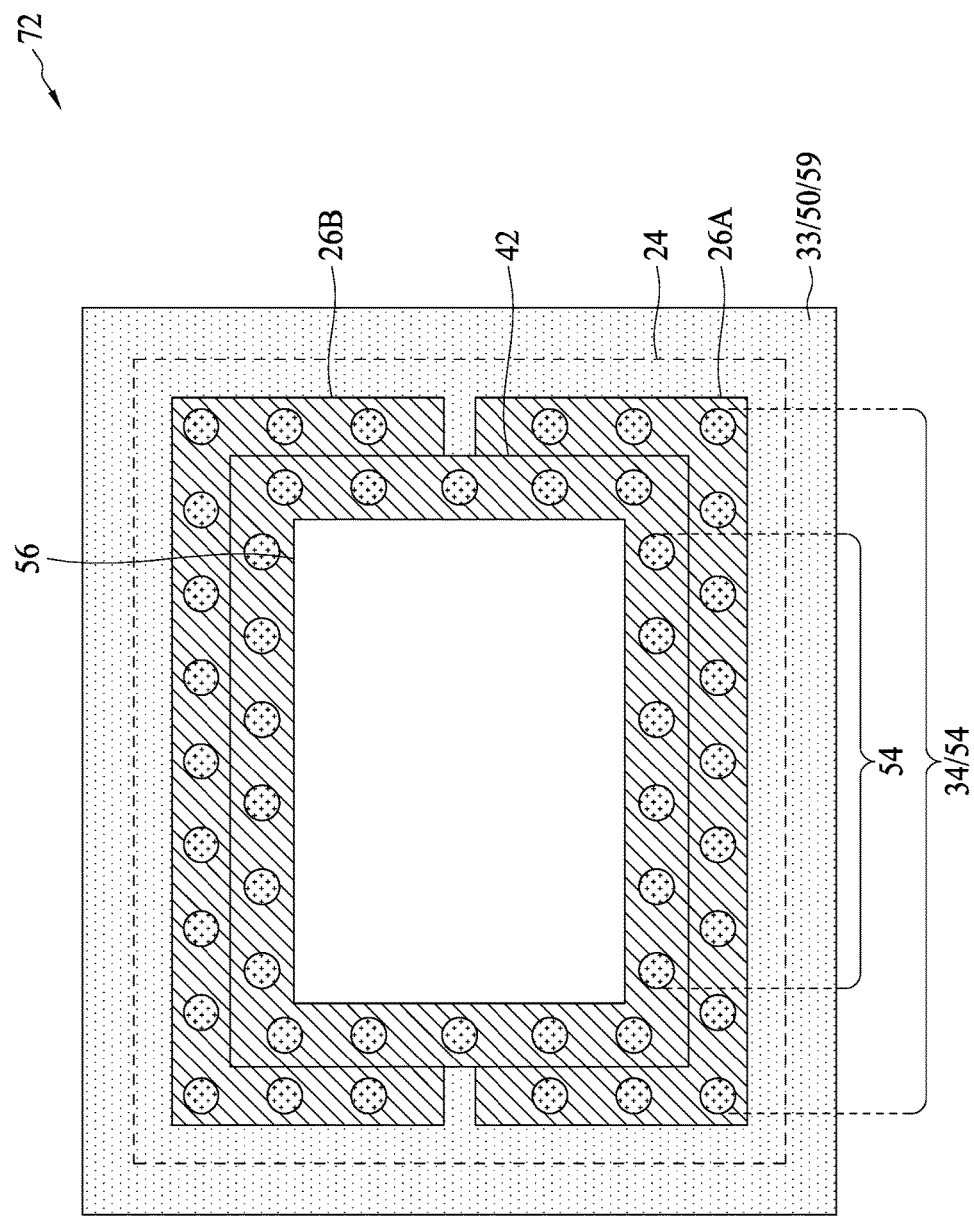
FIG. 22 illustrates a top view of a multi-stacking fan-out package in accordance with some embodiments.

FIG. 22 illustrates a top view of package 72 in accordance with some embodiments. Encapsulating materials 33 encircles first-level device dies 26, and extends into the gap between device dies 26A and 26B. Encapsulating material 50 encircles second-level device die (or device dies) 42 and through-vias 34. Encapsulating material 59 encircles third-level device die (or device dies) 56 and through-vias 54. When the embodiments shown in FIGS. 1 through 14 are adopted, in the resulting package 72, dummy die 24' extends all the way to the edges of package 72. The edges of dummy die 24' thus co-terminate with the edges of encapsulating materials 33, 50, and 59. Alternatively, when the embodiments shown in FIGS. 15 through 21 are adopted, in the resulting package 72, dummy die 24' extends beyond the edges of device dies 26, 42, and 56, and the edges of dummy die 24' do not reach the edges of package 72.

The embodiments of the present disclosure have some advantageous features. Multi-stacking packages may become very thin, even though there may be multiple-levels of device dies, in order to suit to the requirement of demanding applications such as mobile applications. The thin multi-stacking packages thus suffer from warpage. The warpage is further worsened when elongated device dies (refer to the top-view shapes of device dies 26 in FIG. 22) are used. Accordingly, a rigid dummy die is added into the multi-stacking package to provide mechanical support, so that warpage is reduced. The dummy die is also formed of a material having a good thermal conductivity, so that the dummy die can readily conduct heat out of the package, and the thermal dissipation of the multi-stacking package is improved.

In accordance with some embodiments of the present disclosure, a method includes attaching a first-level device die to a dummy die, encapsulating the first-level device die in a first encapsulating material, forming through-vias over and electrically coupled to the first-level device die, attaching a second-level device die over the first-level device die, and encapsulating the through-vias and the second-level device die in a second encapsulating material. Redistribution lines are formed over and electrically coupled to the through-vias and the second-level device die. The dummy die, the first-level device die, the first encapsulating material, the second-level device die, and the second encapsulating material form parts of a composite wafer.

In accordance with some embodiments of the present disclosure, a method includes attaching a dummy wafer over a carrier. The dummy wafer is free from integrated circuit devices. The method further includes thinning the dummy wafer, attaching first-level device dies to the thinned dummy wafer, stacking second-level device dies over the first-level device dies, forming through-vias electrically coupled to the first-level device dies, and forming redistribution lines over and electrically coupled to the through-vias and the second-level device die. A die-saw is performed to separate the dummy wafer, the first-level device dies, and the second-level device dies into a plurality of packages. Each of the plurality of packages includes a dummy die in the dummy wafer, one of the first-level device dies, and one of the second-level device dies.

In accordance with some embodiments of the present disclosure, a package includes a dummy die, a first-level device die over and attached to the dummy die, a first encapsulating material encapsulating the first-level device die, a second-level device die over the first-level device die, and a plurality of through-vias overlapping and electrically connected to the first-level device die. The plurality of through-vias is at a same level as the second-level device die. A second encapsulating material encapsulates the second-level device die and the plurality of through-vias therein. Redistribution lines are over and electrically coupled to the plurality of through-vias and the second-level device die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
a dummy die;
an adhesive film over and contacting the dummy die;
a first-level device die over and attached to the dummy die through the adhesive film;
a first encapsulating material encapsulating the first-level device die;
a second-level device die over the first-level device die;
a plurality of through-vias overlapping and electrically connecting to the first-level device die, wherein the plurality of through-vias are at a same level as the second-level device die;
a second encapsulating material encapsulating the second-level device die and the plurality of through-vias therein; and
redistribution lines over and electrically coupling to the plurality of through-vias and the second-level device die.

2. The package of claim 1, wherein the dummy die comprises a silicon plate.

3. The package of claim 1, wherein the dummy die comprises a metal plate.

4. The package of claim 1, wherein the adhesive film comprises a first edge and a second edge, with the first edge and the second edge being opposite edges of the adhesive film, and the first edge and the second edge are flush with a third edge and a fourth edge, respectively, of the first-level device die.

5. The package of claim 1, wherein the first encapsulating material comprises a portion encircling the dummy die, and the portion of the first encapsulating material is level with the dummy die.

6. The package of claim 1 further comprising:
a dielectric layer overlapping the first-level device die and the first encapsulating material, wherein the dielectric layer separates the first encapsulating material from the second encapsulating material.

7. A package comprising:
a rigid dummy die;
a first die-attach film and a second die-attach film over the rigid dummy die;
a first device die and a second device die attached to the rigid dummy die through the first die-attach film and the second die-attach film, respectively;
a first encapsulating material encapsulating the first device die, the second device die, and the rigid dummy die therein;
a dielectric layer overlapping the first device die, the second device die, and the first encapsulating material;
a third device die over the dielectric layer, wherein the third device die comprises a first portion overlapping a portion of the first device die, and a second portion overlapping a portion of the second device die; and
a second encapsulating material encapsulating the third device die therein.

8. The package of claim 7 further comprising:
a through-via penetrating through the dielectric layer and the second encapsulating material, wherein the through-via has a bottom surface contacting a top surface of an electrical connector in the first device die.

9. The package of claim 8, wherein a top surface of the through-via is substantially coplanar with a top surface of the second encapsulating material.

10. The package of claim 7 further comprising a second dielectric layer overlapping and contacting a top surface of the second encapsulating material and a top surface of the third device die.

11. The package of claim 7, wherein the first encapsulating material further encapsulates the first die-attach film and the second die-attach film therein.

12. The package of claim 7, wherein the rigid dummy die comprises silicon, and the rigid dummy die has no active devices therein.

13. The package of claim 7 further comprising:
a fourth device die overlapping a first portion of the third device die;
a third encapsulating material encapsulating the fourth device die therein; and
an additional through-via overlapping a second portion of the third device die, and the additional through-via penetrates through the third encapsulating material.

14. The package of claim 7, wherein the first encapsulating material extends to a level lower than a bottom surface of the rigid dummy die.

15. A package comprising:
a blank die free from active devices, passive devices, and conductive lines therein;
a first device die over and attached to the blank die through an adhesive film, wherein the first device die comprises a conductive pillar;
a first encapsulating material encapsulating the first device die therein;
a dielectric layer comprising a bottom surface contacting a top surface of the first device die and a top surface of the first encapsulating material;
a second encapsulating material over the dielectric layer; and
a through-via penetrating through the second encapsulating material and the dielectric layer to contact the conductive pillar of the first device die.

16. The package of claim 15, wherein the blank die extends beyond edges of the first device die.

17. The package of claim 16, wherein edges of the blank die are flush with respective edges of the first encapsulating material and the second encapsulating material.

18. The package of claim 15, wherein the adhesive film is encapsulated in, and is in contact with, the second encapsulating material.

19. The package of claim 15 further comprising:
a second device die encapsulated in the second encapsulating material, wherein the second device die overlaps a first portion of the first device die, and the second encapsulating material and the through-via overlap a second portion of the first device die.

20. The package of claim 1, wherein the first encapsulating material physically contacts the adhesive film.

* * * * *